United States Patent
Kang

(10) Patent No.: US 6,388,472 B1
(45) Date of Patent: May 14, 2002

(54) WORD LINE DECODER

(75) Inventor: Hyeok Kang, Seoul (KR)

(73) Assignee: Hyundai Electronics Industries Co., Ltd., Kyungki-Do (KR)

( * ) Notice: Subject to any disclaimer, the term of this patent is extended or adjusted under 35 U.S.C. 154(b) by 0 days.

(21) Appl. No.: 09/721,671

(22) Filed: Nov. 27, 2000

(30) Foreign Application Priority Data

Dec. 27, 1999 (KR) .............................................. 99-62978

(51) Int. Cl.[7] ................................................. G11C 8/00
(52) U.S. Cl. ................... 326/106; 326/105; 365/230.06
(58) Field of Search ..................... 365/230.06; 326/105, 326/106

(56) References Cited

U.S. PATENT DOCUMENTS

| | | | | |
|---|---|---|---|---|
| 4,514,829 A | * | 4/1985 | Chao ........................... | 365/189 |
| 5,229,967 A | * | 7/1993 | Nogle et al. ................. | 365/208 |
| 5,696,721 A | * | 12/1997 | McAdams et al. ..... | 365/189.11 |
| 5,896,340 A | * | 4/1999 | Wong et al. ........... | 365/230.03 |
| 5,986,917 A | * | 11/1999 | Lee ............................... | 365/96 |
| 6,031,784 A | * | 2/2000 | Ong ....................... | 365/230.06 |
| 6,064,623 A | * | 5/2000 | Ha ......................... | 365/230.06 |
| 6,233,198 B1 | * | 5/2001 | Choi ....................... | 365/230.06 |
| 6,278,297 B1 | * | 8/2001 | DeSoto et al. .............. | 326/108 |
| 6,285,593 B1 | * | 9/2001 | Wong ..................... | 365/185.23 |

* cited by examiner

Primary Examiner—Michael Tokar
Assistant Examiner—Khai Nguyen
(74) Attorney, Agent, or Firm—Pennie & Edmonds LLP

(57) ABSTRACT

A word line decoder is characterized in that addresses for decoding word lines are divided into a global word line and a local word line, and if said global word line is selected, a voltage generated at said local word line is applied to a selected word line, but if said global word line is not selected, the voltage applied to said word line is passed to a ground terminal.

13 Claims, 3 Drawing Sheets

WORD LINE DECODER

FIELD OF THE INVENTION

The invention relates generally to a word line. More particularly, the present invention relates to a word line in which the number of transistors constituting a word line decoder is reduced, thus reducing loading of boosting voltage and thus increasing reliability of a device.

BACKGROUND OF THE INVENTION

In order to perform read or write operation by selecting a specific cell in a flash memory cell, a corresponding cell is selected by word line and bit line select signals. Respective decoders are used to select these word line and bit lines.

Referring to FIG. 1, a circuit diagram of the conventional word line decoder will be explained below.

As can be seen from FIG. 1, a first PMOS transistor P11 is connected between the power supply terminal and the first node Q11 and is driven depending on a reset signal XRST. A second PMOS transistor P12 is connected between a power supply terminal VPPX and a second mode Q12 and is driven depending on the potential of an output terminal WL. A third PMOS transistor P13 is connected between the power supply terminal VPPX and the output terminal WL and is driven depending on the potential of the second node Q12. A first NMOS transistor N11 is connected between the first node Q11 and the second node Q12, and the gate terminal of which is applies the power supply voltage so that it can be always kept turned on. A second NMOS transistor N12 is connected between the first node Q11 and a control signal input terminal XCOM and is driven depending on a decoder signal XPREA. A third NMOS transistor N13 being a triple-well NMOS transistor is connected between the second power supply terminal VEEX and the output terminal WL and is driven depending on the power supply voltage Vcc and the second power supply terminal VEEX.

The conventional word line decoder as mentioned above is applied with different power supplies depending on program, erase and read operation. However, only the read operation will be explained below for simplicity.

In order to perform the read operation, the first power supply VPPX of the power supply voltage Vcc, the reset signal XRST of 0V, the second power supply VEEX of 0V, the decoder signal XPREA of the power supply voltage Vcc and the control signal XCOM of 0V are applied. At this time, the output signal WL must be the power supply voltage Vcc.

The first PMOS transistor P11 is turned on by the reset signal XRST to provide the first node Q11 with the power supply voltage Vcc. However, as the second NMOS transistor N12 is turned on by the decoder signal XPREA, and is thus applied with the control signal XCOM of a LOW state, the potential of the first node Q11 is passed to the control signal input terminal. Therefore, the first node Q11 maintains the potential of a LOW state. The potential of the first node Q11 is passed to the second node Q12, through the first NMOS transistor N11 always kept turned on since the gate terminal of which is applied with the power supply voltage Vcc. By means of the potential of the second node Q12 kept at LOW state, the third PMOS transistor P13 is turned on to provide the output terminal WL with the power supply voltage Vcc. As the output terminal WL is kept at the potential of the power supply voltage Vcc, the second PMOS transistor P12 is turned off and the second node Q12 is thus kept at LOW state. On the other hand, as the first node Q11 is kept at LOW state, the third NMOS transistor N13 is turned off and the third power supply VEEX is thus not supplied to the output terminal WL.

As mentioned above, the first power supply VPPX is directly transferred to operate the word line the word line decoder, depending on the reset signal XRST and the control signal XCOM.

In order to perform the above-mentioned operation, the conventional word line decoder employs six (6) transistors. However, in a situation where the number of decoders are required as many as the number of word lines, a lot of the transistors gives a significant burden on the chip size. Also, in a device that is driven with a low voltage, the boosting voltage must be applied to the word line. However, as the first power supply VPPX is applied to unselected word lines, loading by the boosting voltage will cause a serious problem.

SUMMARY OF THE INVENTION

It is therefore an object of the present invention to provide a word line decoder capable of not only reducing the chip size but also solving the loading problem.

In order to accomplish the above object, a word line decoder according to the present invention is characterized in that wherein addresses for decoding word lines are divided into a global word line and a local word line, and if said global word line is selected, a voltage generated at said local word line is applied to a selected word line, but if said global word line is not selected, the voltage applied to said word line is passed to a ground terminal.

BRIEF DESCRIPTION OF THE DRAWINGS

The aforementioned aspects and other features of the present invention will be explained in the following description, taken in conjunction with the accompanying drawings, wherein.

DETAILED DESCRIPTION OF PREFERRED EMBODIMENTS

The present invention will be described in detail by way of a preferred embodiment with reference to accompanying drawings.

Figure 2:
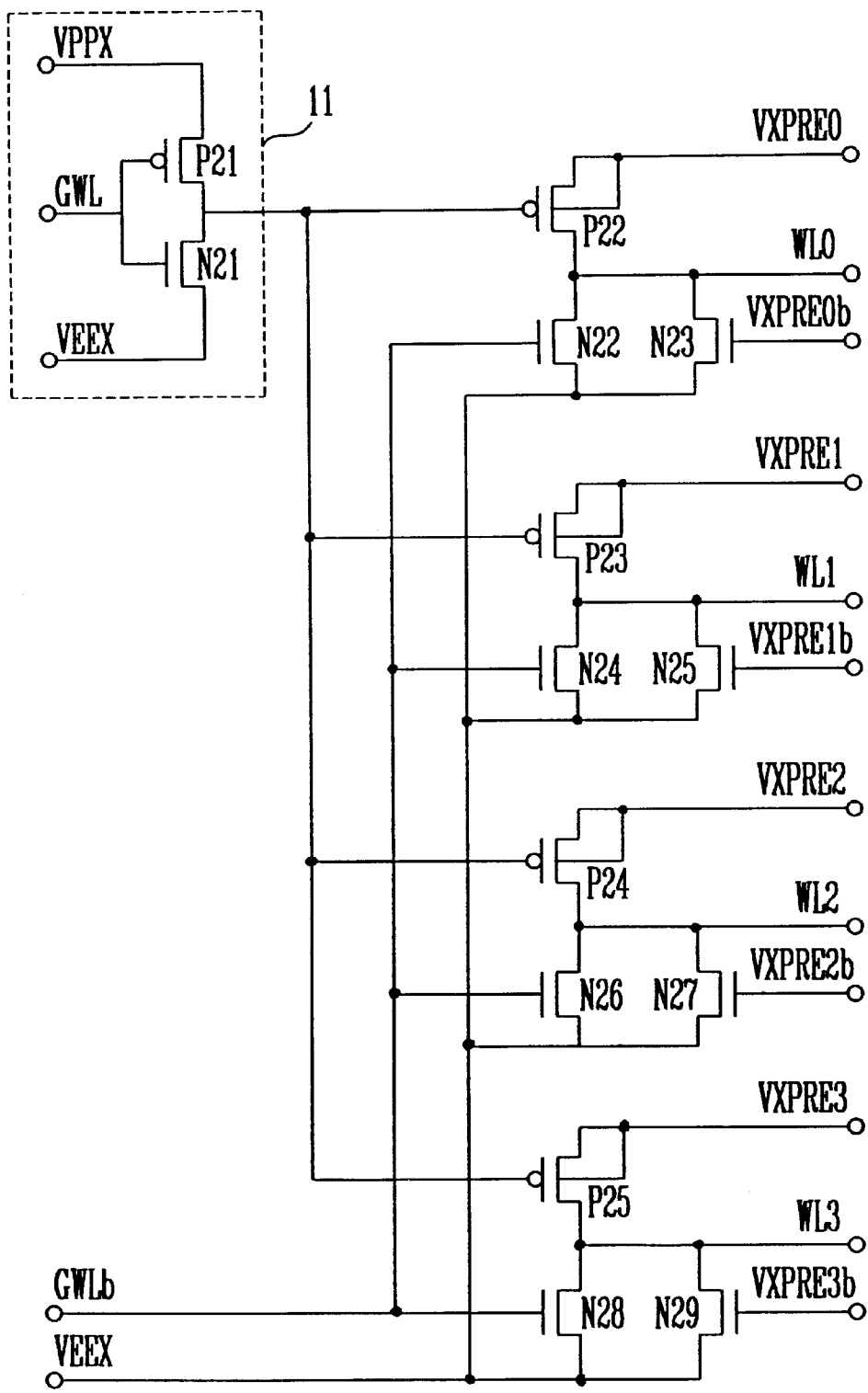
FIG. 2 is a schematic view of a word line to which a word line decoder according to the present invention is connected.

FIG. 2 is a schematic view of a word line to which a word line decoder according to the present invention is connected.

In the present invention, in order to decode the word line, addresses are divided into two groups. Word lines decoded in one group are defined as a global word line (GWL) and word lines decoded in the other group are defined as a local word line (LWL).

A reference numeral 11 in FIG. 2 schematically shows the word line decoder, which selectively supplies the first power supply VPPX and the second power supply VEEX, depending on the global word line GWL. That is, in case that the global word line is not selected, the first PMOS transistor P21 is turned on to supply the first power supply VPPX.

However, in case that the global word line is selected, the first NMOS transistor N21 is turned on to the second power supply VEEX. If the first power supply VPPX is applied, the second to fifth PMOS transistors P22 to P25 are turned off, which prevents first to fourth decoder signals VXPRE0–VXPRE3 from being supplied to the word lines WL0–WL3, respectively. On the other hands, if the second power supply VEEX is applied, the first to fourth decoder signals VXPRE0–VXPRE3 are applied to the word lines WL0–WL3, respectively. Then, the first to fourth decoder bar signals VXPREb0–VXPREb3 turn off the third, the fifth, the seventh and the ninth NMOS transistors N23, N25, N27 and N29, which thus prevents the potentials of each of the word lines WL0–WL3 from being fallen.

Meanwhile, in case that the global word line is not selected, the global word line bar signal GWLb is applied with a HIGH state, and the second, the fourth, and sixth and the eighth NMOS transistors N22, N24, N26 and N28 are thus turned on to pass the potential of each of the word lines WL0–WL3 to the ground terminal Vee, so that they can be kept at the ground potential. On the other hand, in case that the global word line is selected, the global word line bar signal GWLb is applied with a LOW state, and the second, the fourth, the sixth and the eighth NMOS transistors N22, N24, N26 and N28 are thus turned off, so that they can maintain the potentials of each of the word lines WL0–WL3 intact.

In case that the boosting voltage is supplied to the word line by the operation of the above mentioned word line decoder and the word line, any loading can be prevented.

Figure 1:
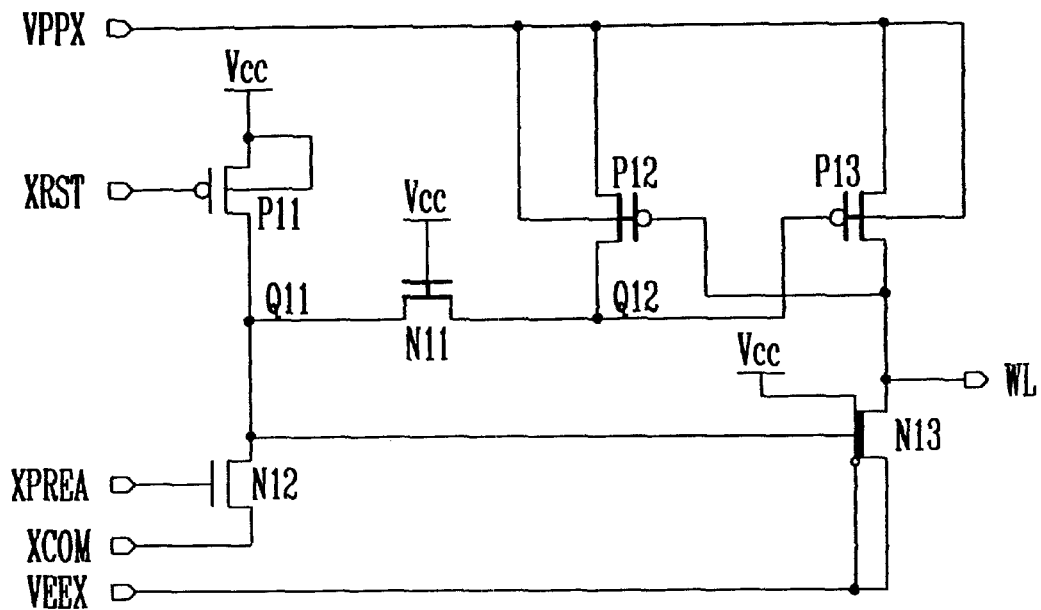
FIG. 1 is a circuit diagram of the conventional word line decoder.
Figure 3:
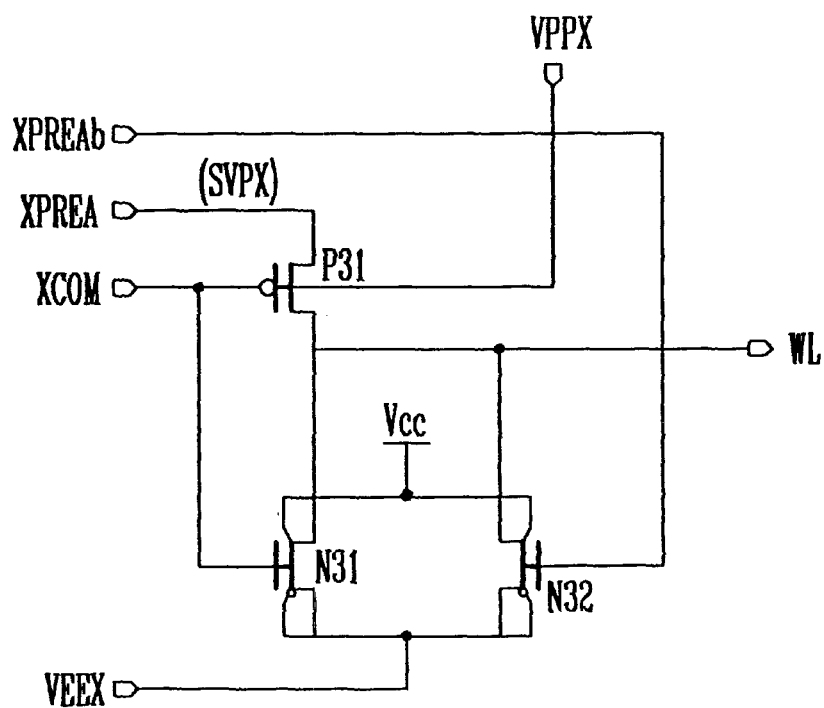
FIG. 3 is a circuit diagram of a word line decoder according to the present invention.

Referring now to FIG. 3, the construction of a word line decoder according to the present invention will be below explained in detail.

The first PMOS transistor P31 is connected between the input terminal of the decoder signal XPREA and the output terminal WL and is also driven depending on the control signal XCOM, wherein to the substrate of which is applied the first power supply VPPX. The first NMOS transistor N31 being the triple-well NMOS transistor is connected between the power supply terminal Vcc and the second power supply VEEX and is also driven depending on the control signal XCOM. Also, the second NMOS transistor N32 being another triple-well NMOS transistor is connected between the power supply terminal Vcc and the second power supply VEEX and is also driven depending on the decoder bar signal XPREAb. At this time, the decoder signal XPREA is outputted from the local word line, is inputted with a time difference than the first power supply VPPX and is a signal having a same phase. The control signal XCOM is a signal outputted from the global word line.

Now, a method of driving the word line decoder constructed above, according to the present invention, will be explained below.

If the control signal XCOM is applied with a LOW state because the global word line GWL is not selected, the first PMOS transistor P31 is turned on. Then, the decoder signal XPREA, which maintains the potential of the power supply voltage Vcc generated in the local word line through the first PMOS transistor P31 turned on, is applied to the output terminal WL, which thus maintains the potential of the power supply voltage Vcc. On the other hand, as the control signal XCOM is applied with a LOW state, the first NMOS transistor N31 is turned off. Also, as the decoder bar signal XPREAb being an inverted signal of the decoder signal XPEREA is applied with a LOW state, the second NMOS transistor N32 is turned off. Therefore, the output terminal WL maintains the potential of the power supply voltage Vcc, which is then outputted to the word line.

If the control signal XCOM is applied with a HIGH state since the global word line GWL is selected, the first PMOS transistor P31 is turned off. As the first PMOS transistor P31 is turned off, the decoder signal XPREA will not be provided. On the other hand, the control signal XCOM is applied with a HIGH state and the first NMOS transistor N31 is thus turned on. As the decoder bar signal XPREAb is applied with a LOW state, the second NMOS transistor N32 is turned off. Therefore, as the potential of the output terminal WL is passed to the second power supply VEEX maintaining a relatively low potential through the first NMOS transistor N31 turned on, it becomes a LOW state, which is then applied to the word line.

Figure 4:
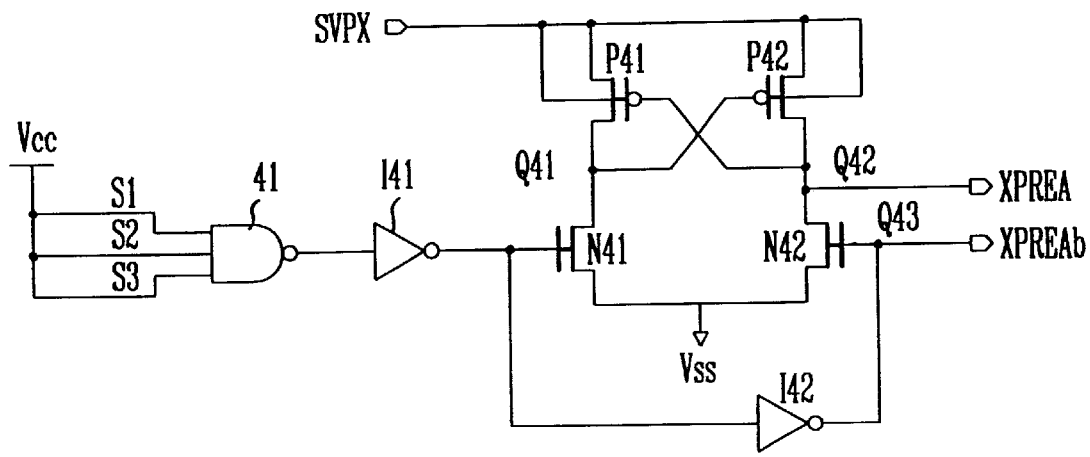
FIG. 4 is a circuit diagram of a local word line driver according to the present invention.

Referring now to FIG. 4, the construction of a local word line driver according to the present invention will be below explained in detail.

The first PMOS transistor P41 having the same phase as the first power supply VPPX is connected between the third power supply SVPX, that is applied with some delay than the first power supply VPPX, and the first node Q41, and is also driven depending on the potential of the second node Q42. The second PMOS transistor P42 is connected between the third power supply SVPX and the second node Q42 and is also driven depending on the potential of the first node Q41. The NAND gate 41 uses the first, second and third control signals S1, S2 and S3 as inputs and then outputs a logical combination of them. The first inverter 141 inverts the output signal of the NAND gate 41. The first NMOS transistor N41 is connected between the first node Q41 and the ground terminal Vss and is also driven depending on the output signal of the first inverter 141. Also, the second NMOS transistor N42 is connected between the second node Q42 and the third node Q43 and is also driven depending on the output signal of the second inverter 142 to invert the output signal of the first inverter 141. At this time, the first control signal S1 is a word line select signal, the second control signal S2 is a block select signal and the third control signal S3 is an address decode signal. Also, the potential of the second node Q42 is the decoder signal XPREA and the potential of the third node Q43 is the decoder bar signal XPREAb.

Now, a method of driving the local word line driver constructed above will be explained as follows:

The first, second and third control signal S1, S2 and S3 each are applied to the NAND gate 41 with a HIGH state, are logically combined and are then outputted as a signal of a LOW state. Then, the output signal of the NAND gate 41, which is outputted as a LOW state, is inverted into a HIGH state through the first inverter 141. Thus, the first NMOS transistor N41 is turned on by the signal inverted into a HIGH state through the first inverter 141. Also, the output signal of the first inverter 141 is inverted into a LOW state via the second inverter 142 and is then provided to the third node Q43. The potential of the third node Q43 to maintain a LOW state is outputted as the decoder bar signal XPREAb. By means of this signal, the second NMOS transistor N42 is turned off. Meanwhile, as the potential of the first node Q41 falls to the ground potential through the first NMOS transistor N41 turned on, the second PMOS transistor P42 is turned off. Then, the potential of the third power supply SVPX is provided to the second node Q42 through the second PMOS transistor P42 turned on. Therefore, the second node Q42 maintains the potential of the power supply voltage Vcc, which is then outputted as the decoder signal XPREA. Also, as the second node Q42 is maintained at HIGH state, the first PMOS transistor P41 is turned off, which prevents the third power supply SVPX from being supplied to the first node Q41.

Figure 5:
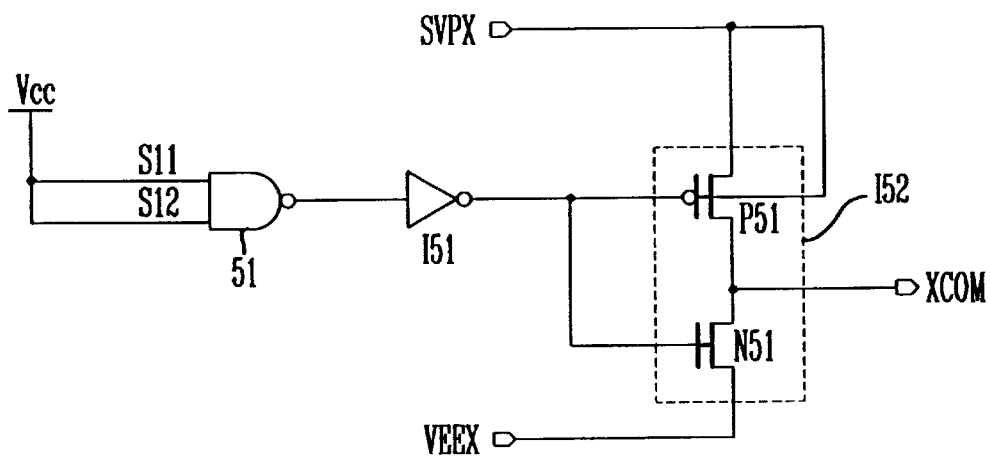
FIG. 5 is a circuit diagram of a global word line driver according to the present invention.

Referring now to FIG. 5, the construction of a global word line driver will be explained in detail below.

The NAND gate 51 receives the first and second control signals S11 and S12, logically and outputs a logical combination of them. The first control signal S11 is an address decode signal, which is one of the signals selected among a group in which a plurality of addresses are bundled. The second control signal S12 is also same as the first control signal S11, but is one of the signals selected among a group in which the first control signal S11 and a plurality of different addresses are bundled. The first inverter 151 inverts the output signal of the NAND gate 51, which is then inputted into the gate terminals of the first PMOS transistor P51 and the first NMOS transistor N51. At this time, the first PMOS transistor P51 and the first NMOS transistor N51 constitutes the second inverter 152. Thus, the first PMOS transistor P51 supplies the third power supply SVPX to the output node, and the first NMOS transistor N51 supplies the second power supply VEEX to the output node. Then, the potential of the output node is outputted as the control signal XCOM.

Now, a method of driving the global word line driver as mentioned above will be explained below.

If the first and second control signals S11 and S12 each are inputted to the NAND gate 51 with a HIGH state, they are logically combined in the NAND gate 51 and are thus outputted as a signal of a LOW state. Then, the output signal of the NAND gate 51, which is outputted as a LOW state, is inverted into a HIGH state through the first inverter 151. Thus, by the output signal of the first inverter 151 outputted as a HIGH state, the first PMOS transistor P51 is turned off and the first NMOS transistor N51 is turned on. Also, as the potential of the output node is passed to the terminal of the second power supply VEEX maintaining a negative high voltage, through the first NMOS transistor N51 turned on, the output node is maintained at a LOW state. The potential of this LOW state is outputted as the control signal XCOM.

Meanwhile, if one or both of the first and second control signals S11 and S12 is applied with a LOW state, a signal of a HIGH state is outputted via the NAND gate 51. Then, the output signal of the NAND gate 51, which is outputted as a HIGH state, is inverted into a LOW state through the first inverter 151. Thus, by means of the signal inverted into the LOW state through the first inverter 151, the first PMOS transistor P51 is turned on and the first NMOS transistor N51 is turned off. Therefore, the third power supply SVPX is supplied to the output node through the first PMOS transistor P51 turned on, which is outputted as the control signal XCOM.

As mentioned above, the present invention reduces the number of transistors constituting a decoder to three (3). Thus, it could not only reduce the chip size more than twice, compared to the conventional decoder, but also reduce loading of word lines to which a boosting voltage is applied, thus improving reliability of the word lines. Therefore, the present invention can reduce the chip size of a device and can also improve its speed, in a device that is driven with a low voltage.

The present invention has been described with reference to a particular embodiment in connection with a particular application. Those having ordinary skill in the art and access to the teachings of the present invention will recognize additional modifications and applications within the scope thereof.

It is therefore intended by the appended claims to cover any and all such applications, modifications, and embodiments within the scope of the present invention.

What is claimed is:

1. A word line decoder, comprising:
    a first circuit, wherein addresses for decoding word lines are divided into a global word line and a local word line, for supplying a given voltage of a decoder signal generated at said local word line to said word lines, depending on a control signal generated at said global word line;
    a second circuit for falling the potential of said word line to a ground potential, depending on a control signal generated at said global word line; and
    a third circuit for initializing the potential of said word line to said ground potential, depending on an inverted signal of said decoder signal generated at said local word line.

2. The word line decoder according to claim 1, wherein said first circuit is a PMOS transistor which is connected between a decoder signal output terminal of said local word line and said word line and is driven depending on a control signal generated at said global word line.

3. The word line decoder according to claim 1, wherein said second circuit is a NMOS transistor which is connected between said word line and a power supply terminal for applying a negative high voltage and is driven depending on a control signal generated at said global word line.

4. The word line decoder according to claim 1, wherein said third circuit is a NMOS transistor which is connected between said word line and a power supply terminal for applying a negative high voltage and is driven depending on an inverted signal of a decoder signal generated at said local word line.

5. The word line decoder according to claim 1, wherein the control signal generated at said global word line is generated by:
    a logic gate for logically combining first and second control signals;
    a first inverter for inverting an output signal of said logic gate; and
    a second inverter for inverting an output signal of said first inverter.

6. The word line decoder according to claim 5, wherein said logical logic gate is a NAND gate.

7. The word line decoder according to claim 5, wherein said second inverter comprises:
    a PMOS transistor which is connected between a positive high voltage input terminal and an output terminal and is driven depending on an output signal of said first inverter; and
    a NMOS transistor which is connected between said output terminal and a negative high voltage input terminal and is driven depending on an output signal of said first inverter.

8. The word line decoder according to claim 1, wherein the decoder signal and its inverted signal generated at said local word line is outputted by:

a logic gate for logically combining a plurality of control signals;

a first inverter for inverting an output signal of said logic gate;

a first circuit for adjusting the potential of a first node, depending on an output signal of said first inverter;

a second inverter for inverting an output signal of said first inverter to adjust the potential of a second output terminal;

a second circuit for adjusting the potential of a first output terminal, depending on an output signal of said second inverter;

a third circuit for supplying a positive high voltage to said first output terminal, depending on the potential of said first node; and a fourth circuit for adjusting the potential of said first node, depending on the potential of said first output terminal.

9. The word line decoder according to claim 8, wherein said logic gate is a NAND gate.

10. The word line decoder according to claim 8, wherein said first circuit is a NMOS transistor which is connected between said first node and said ground terminal and is driven depending on the output signal of said first inverter.

11. The word line decoder according to claim 8, wherein said second circuit is a NMOS transistor which is connected between said first output terminal and the ground terminal and is driven depending on the output signal of said second inverter.

12. The word line decoder according to claim 8, wherein said third circuit is a PMOS transistor which is connected between the positive high voltage input terminal and said first output terminal and is driven depending on the potential of said first node.

13. The word line decoder according to claim 8, wherein said fourth circuit is a PMOS transistor which is connected between the positive high voltage input terminal and said first node and is driven depending on the potential of said first output terminal.

* * * * *